US012665553B2

(12) United States Patent
He et al.

(10) Patent No.: US 12,665,553 B2
(45) Date of Patent: Jun. 23, 2026

(54) DUAL-FREQUENCY LOW-NOISE AMPLIFIER CIRCUIT

(71) Applicant: SMARTER MICROELECTRONICS (GUANG ZHOU) CO., LTD., Guangzhou (CN)

(72) Inventors: Minjun He, Guangzhou (CN); Yaohua Zheng, Guangzhou (CN); Ping Li, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 838 days.

(21) Appl. No.: 18/064,247

(22) Filed: Dec. 9, 2022

(65) Prior Publication Data

US 2023/0104189 A1 Apr. 6, 2023

Related U.S. Application Data

(63) Continuation of application No. PCT/CN2021/106349, filed on Jul. 14, 2021.

(30) Foreign Application Priority Data

Aug. 25, 2020 (CN) .......................... 202010866065.X

(51) Int. Cl.
*H03F 1/56* (2006.01)
*H03F 3/19* (2006.01)
(52) U.S. Cl.
CPC ............... *H03F 1/565* (2013.01); *H03F 3/19* (2013.01); *H03F 2200/222* (2013.01); *H03F 2200/294* (2013.01); *H03F 2200/387* (2013.01); *H03F 2200/451* (2013.01)

(58) Field of Classification Search
CPC ...... H03F 1/565; H03F 3/19; H03F 2200/222; H03F 2200/294; H03F 2200/387; H03F 2200/451; H03F 1/56; H03F 3/21
USPC ......................................................... 330/297
See application file for complete search history.

(56) References Cited

FOREIGN PATENT DOCUMENTS

CN     101316095 A  * 12/2008
CN     105141263 A  * 12/2015

* cited by examiner

*Primary Examiner* — Andrea Lindgren Baltzell
*Assistant Examiner* — Jose E Pinero
(74) *Attorney, Agent, or Firm* — Syncoda LLC; Feng Ma

(57) ABSTRACT

A dual-frequency low-noise amplifier circuit includes an input impedance matching circuit, a radio-frequency signal amplifying circuit and an output impedance matching circuit. An input end of the input impedance matching circuit inputs a radio-frequency signal, and an output end is connected to an input end of the output impedance matching circuit by means of the radio-frequency signal amplifying circuit; an output end of the output impedance matching circuit outputs an amplified radio-frequency signal; a first band radio-frequency signal is amplified, input and output switches are in a first open and closed state, and input and output impedances are first input and output impedances; and a second band radio-frequency signal is amplified, the input and output switches are in a second open and closed state, and the input and output impedances are second input and output impedances. Adjusting the dual-frequency low-noise amplifier circuit can reduce signal reflection and improve signal quality.

7 Claims, 5 Drawing Sheets

DUAL-FREQUENCY LOW-NOISE AMPLIFIER CIRCUIT

CROSS-REFERENCE TO RELATED APPLICATIONS

This is a continuation of International Application No. PCT/CN2021/106349 filed on Jul. 14, 2021, which claims priority to Chinese Patent Application No. 202010866065.X filed on Aug. 25, 2020. The disclosures of the above-referenced applications are hereby incorporated by reference in their entirety.

BACKGROUND

A Low Noise Amplifier (LNA) is generally used as a front end of a radio frequency (RF) receiver and is an essential part of the RF receiver. Application environment of LNA is generally wireless communication or Global Positioning System (GPS) positioning and navigation. Since a RF signal generated by the wireless communication or GPS positioning and navigation is weak, LNA is required to reduce interference of its own noise to RF signal, and improve a power gain as much as possible. Furthermore, other indices such as input matching, output matching, linearity or the like should be considered, so as to ensure that a RF signal received by the RF receiver has good quality.

SUMMARY

The disclosure relates to the field of designing an integrated circuit (IC), and in particular to a dual-frequency low-noise amplifier circuit.

In a first aspect, an embodiment of the disclosure provides a dual-frequency low-noise amplifier circuit, including an input impedance matching circuit including an input switch component, a RF signal amplification circuit, and an output impedance matching circuit including an output switch component.

An input end of the input impedance matching circuit is input with a RF signal, an output end of the input impedance matching circuit is connected to an input end of the output impedance matching circuit through the RF signal amplification circuit, and an output end of the output impedance matching circuit outputs an amplified RF signal.

In response to the RF signal amplification circuit amplifying a RF signal in a first band, the input switch and the output switch are controlled to be in a first opening and closed state, such that an impedance of the input impedance matching circuit is a first input impedance, and an impedance of the output impedance matching circuit is a first output impedance.

In response to the RF signal amplification circuit amplifying a RF signal in a second band, the input switch and the output switch are controlled to be in a second opening and closed state, such that the impedance of the input impedance matching circuit is a second input impedance, and the impedance of the output impedance matching circuit is a second output impedance.

In the above solution, the RF signal amplification circuit may include a first transistor, a second transistor, a third transistor, a first capacitor and a first voltage source. A drain of the first transistor is connected to a drain of the second transistor and a source of the third transistor, a source of the first transistor is connected to a source of the second transistor, and a gate of the first transistor and a gate of the second transistor are connected to the output end of the input impedance matching circuit. A drain of the third transistor is connected to the input end of the output impedance matching circuit, a gate of the third transistor is grounded through the first capacitor and is further connected to the first voltage source.

In the above solution, the input impedance matching circuit may further include a first inductor, a second inductor, a second capacitor and a third capacitor, and the input switch component may include a first switch and a second switch. A first end of the first inductor is used as the input end of the input impedance matching circuit, a second end of the first inductor is connected to the gate of the first transistor through the second capacitor and is connected in series with the third capacitor through the first switch and then connected to the gate of the second transistor, a first end of the second switch is connected to the gate of the second transistor, and a second end of the second switch is grounded, a first end of the second inductor is connected to the source of the first transistor, and a second end of the second inductor is grounded.

In the above solution, the output impedance matching circuit may further include a third inductor, a fourth capacitor, a fifth capacitor and a second voltage source, and the output switch component may include a third switch. A first end of the third inductor is used as the input end of the output impedance matching circuit and is connected to a first end of the fourth capacitor and a first end of the fifth capacitor, a second end of the fifth capacitor is used as the output end of the output impedance matching circuit, and a second end of the fourth capacitor is connected to a second end of the third inductor and the second voltage source through the third switch.

In the above solution, the first opening and closed state may be that each of the first switch and the third switch is in an opening state, and the second switch is in a closed state, and the second opening and closed state may be that each of the first switch and the third switch is in a closed state, and the second switch is in an opening state.

In the above solution, the dual-frequency low-noise amplifier circuit may further include a first bias circuit and a second bias circuit. The first bias circuit is connected to the gate of the first transistor, and is configured to provide a first bias voltage. The second bias circuit is connected to the gate of the second transistor, and is configured to provide a second bias voltage.

In the above solution, the first bias circuit may include a first bias current source, a fourth transistor and a third voltage source. A drain of the fourth transistor is connected to the third voltage source through the first bias current source and is short-connected to a gate of the fourth transistor, and a source of the fourth transistor is grounded. The second bias circuit may include a second bias current source, a fifth transistor and a fourth voltage source. A drain of the fifth transistor is connected to the fourth voltage source through the second bias current source and is short-connected to a gate of the fifth transistor, and a source of the fifth transistor is grounded.

In the above solution, the first bias circuit may further include a first resistor, through which the gate of the fourth transistor is connected to the gate of the first transistor, and the second bias circuit may further include a second resistor, through which the gate of the fifth transistor is connected to the gate of the second transistor.

In some embodiments, the first band may be a high band, and the second band may be a low band.

According to technical solutions of the embodiments of the disclosure, input impedance and output impedance of the matching circuit are adjusted by controlling opening and closed states of the switch, such that the input impedance and output impedance of the matching circuit are matched with source impedance of the RF signal and source imped-ance of the amplified RF signal respectively, thereby reduc-ing signal reflection and improving signal quality. Further-more, optimal noise matching, gain and linearity may also be provided for RF signals in different bands.

DETAILED DESCRIPTION

In order to enable a more detailed understanding of features and technical contents of embodiments of the disclosure, implementation of the embodiments of the dis-closure will be described in detail below in combination with the accompanying drawings which are provided for reference and illustration only and are not intended to limit the embodiments of the disclosure.

In some implementations, implementation of dual-fre-quency amplification by LNA mainly includes two technical solutions.

In a first solution, dual-frequency amplification of oper-ating RF signals in two bands is implemented by two independent LNAs. This technical solution needs to use different input and output matching components, which is difficult to meet requirements of high integration level and low cost.

In a second solution, RF signals in different bands share one channel, and broadband matching networks are adopted at input and output ends respectively, to directly cover different operating bands. The second solution solves the problem of high integration level and cost, however, when a required operating band is covered by the way of broad-band matching amplification, RF signal in a non-operating band may also be amplified, resulting in RF signal blocking. When only the RF signal in the operating band is amplified by using the second solution, it has higher requirement for linearity, and it is difficult to match optimal noise coefficient and gain.

In some implementations, when dual-frequency amplifi-cation is implemented by LNA, RF signals in different bands share one channel, and broadband matching networks are adopted at input and output ends respectively, to directly cover different operating bands. When a required operating band is covered by the way of broadband matching ampli-fication, RF signal in a non-operating band may also be amplified, resulting in RF signal blocking. When only the RF signal in the operating band is amplified by using the above solution, it has higher requirement for linearity, and it is difficult to match optimal noise coefficient and gain.

Based on the problem existing in some implementations that RF signal in the operating band is amplified while RF signal in the non-operating band may also be amplified, the disclosure provides a dual-frequency low-noise amplifier circuit which is configured to implement optimal noise matching, gain and linearity for RF signals in different bands.

Figure 1:
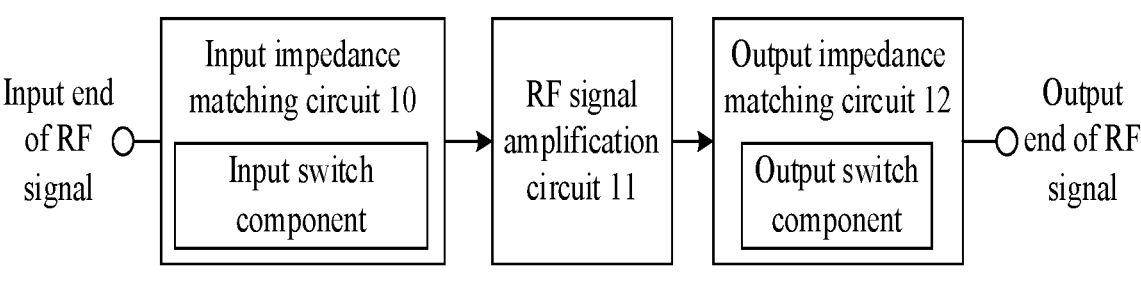
FIG. 1 is a schematic diagram of a first composition structure of a dual-frequency low-noise amplifier circuit in an embodiment of the disclosure.

FIG. 1 is a schematic diagram of a first composition structure of a dual-frequency low-noise amplifier circuit in an embodiment of the disclosure. As shown in FIG. 1, the dual-frequency low-noise amplifier circuit includes an input impedance matching circuit 10 including an input switch component, a RF signal amplification circuit 11, and an output impedance matching circuit 12 including an output switch component.

An input end of the input impedance matching circuit is input with a RF signal, an output end of the input impedance matching circuit is connected to an input end of the output impedance matching circuit through the RF signal amplifi-cation circuit, and an output end of the output impedance matching circuit outputs an amplified RF signal.

In response to the RF signal amplification circuit ampli-fying a RF signal in a first band, the input switch and the output switch are controlled to be in a first opening and closed state, such that an impedance of the input impedance matching circuit is a first input impedance, and an imped-ance of the output impedance matching circuit is a first output impedance.

In response to the RF signal amplification circuit ampli-fying a RF signal in a second band, the input switch and the output switch are controlled to be in a second opening and closed state, such that the impedance of the input impedance matching circuit is a second input impedance, and the impedance of the output impedance matching circuit is a second output impedance.

It should be noted that each of the input impedance matching circuit and the output impedance matching circuit also include other matching elements, such as one of a capacitor, an inductor or a resistor, or any combination of a capacitor, an inductor and a resistor. The input switch and output switch may control access modes of matching ele-ments in the input impedance matching circuit and the output impedance matching circuit, so as to adjust imped-ance of the matching circuits.

It should be noted that input impedance matching refers to that source impedance of a RF signal and impedance of the input impedance matching circuit achieve a mutual match-ing effect, and output impedance matching refers to that source impedance of the amplified RF signal and impedance of the output impedance matching circuit achieve a mutual matching effect. The impedance matching is used to sup-press reflection of RF signals.

It should be noted that due to reflection of RF signal during transmission, a reflected signal may be aliased with an original RF signal and thus affect quality of RF signal. Therefore, when RF signal is input into the RF signal amplification circuit to implement signal amplification, or before the amplified RF signal is output, the impedance matching is required to reduce signal reflection and improve signal quality. Furthermore, optimal noise matching, gain and linearity may also be implemented for RF signals in different bands.

Specifically, when RF signal is in the first band, the input switch and the output switch are controlled to be in the first opening and closed state, such that RF signal in the first band matches a corresponding impedance with the dual-frequency low-noise amplifier circuit, that is, the impedance of the input impedance matching circuit is the first input impedance, and the impedance of the output impedance matching circuit is the first output impedance. When RF signal is in the second band, the input switch and the output switch are controlled to be in the second opening and closed state, such that RF signal in the second band matches a corresponding impedance with the dual-frequency low-noise amplifier circuit, that is, the impedance of the input impedance matching circuit is the second input impedance, and the impedance of the output impedance matching circuit is the second output impedance.

Figure 2:
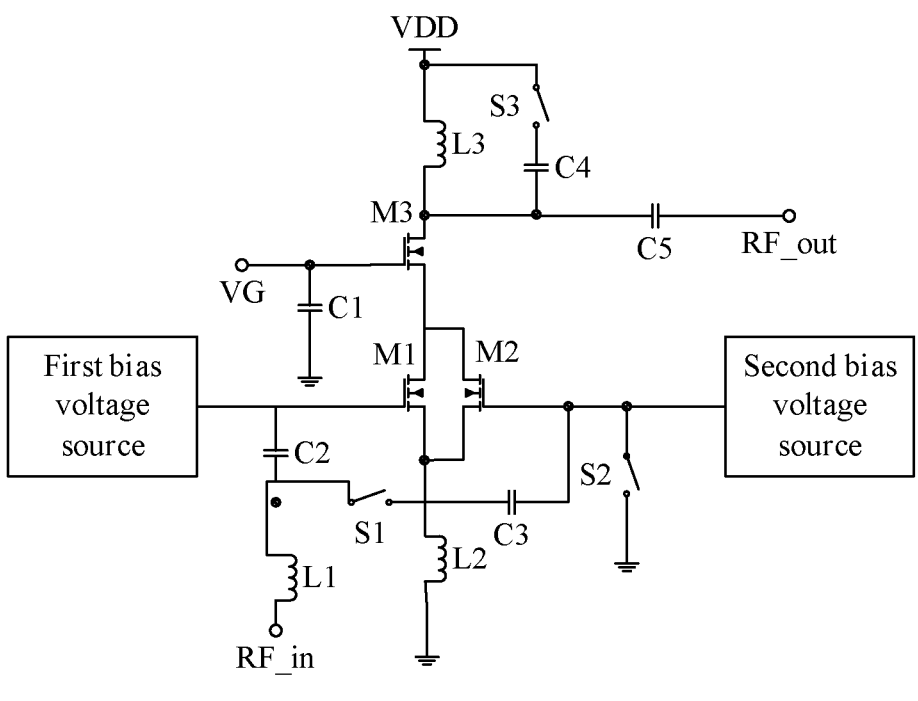
FIG. 2 is a schematic diagram of a second composition structure of a dual-frequency low-noise amplifier circuit in an embodiment of the disclosure.

For the schematic diagram of the first composition structure of the dual-frequency low-noise amplifier circuit in FIG. 1, the disclosure provides a specific diagram of a circuit structure thereof, FIG. 2 is a schematic diagram of a second composition structure of a dual-frequency low-noise amplifier circuit in an embodiment of the disclosure.

As shown in FIG. 2, the RF signal amplification circuit may specifically include a first transistor M1, a second transistor M2, a third transistor M3, a first capacitor C1 and a first voltage source VG. Specific connection thereof is as follows. A drain of M1 is connected to a drain of M2 and a source of M3, a source of M1 is connected to a source of M2, and a gate of M1 and a gate of M2 are connected to the output end of the input impedance matching circuit. A drain of M3 is connected to the input end of the output impedance matching circuit, a gate of M3 is grounded through C1 and is further connected to VG.

Here M1 and M2 are common source transistors, that is, the gate of M1 and the gate of M2 are used as a signal input end, the drain of M1 and the drain of M2 are used as a signal output end, and the source of M1 and the source of M2 are used as a common end. M3 is a common gate transistor, that is, the source of M3 is used as a signal input end, the drain of M3 is used as an output end, and the gate of M3 is used as a common end.

In a practical application, the gate of M1 is used as an input end of the RF signal amplification circuit, or both the gate of M1 and the gate of M2 are used as the input end of the RF signal amplification circuit, which is mainly determined by a state of the input switch component in the input impedance matching circuit.

Here VG drives C1 such that RF ground is provided to M3.

It should be noted that bias voltages should be provided to M1 and M2 respectively, to make M1 and M2 in operating states thereof. Here a bias voltage is provided to M1 through a first bias voltage source, such that the drain and source of M1 are turned on. A bias voltage is provided to M2 through a second bias voltage source, such that the drain and source of M2 are turned on.

FIG. 2 also shows an optional input impedance matching circuit and an output impedance matching circuit. As shown in FIG. 2, the input impedance matching circuit may further include a first inductor L1, a second inductor C2, a third capacitor C3 and a second inductor L2, and the output switch component may include a first switch S1 and a second switch S2. Specific connection thereof is as follows. A first end of L1 is used as the input end RF in of the input impedance matching circuit, a second end of L1 is connected to the gate of M1 through C2, the second end of L1 is also connected to the gate of M2 through S1 and C3, a first end of S2 is connected to the gate of M2, and a second end of S2 is grounded, a first end of L2 is connected to the source of M1 and the source of M2, and a second end of L2 is grounded.

The output impedance matching circuit may further include a third inductor L3, a fourth capacitor C4, a fifth capacitor C5 and a second voltage source VDD, and the output switch component may include a third switch S3. Specific connection thereof is as follows. A first end of L3 is used as the input end of the output impedance matching circuit, the first end of L3 is connected to a first end of C4 and a first end of C5, a second end of C5 is used as the output end RF out of the output impedance matching circuit, and a second end of C4 is connected to a second end of L3 and VDD through S3.

When the RF signal amplification circuit amplifies RF signal in the first band, S1, S2 and S3 are controlled to be in the first opening and closed state, such that the impedance of the input impedance matching circuit is the first input impedance, and the impedance of the output impedance matching circuit is the first output impedance. When the RF signal amplification circuit amplifies RF signal in the second band, S1, S2 and S3 are controlled to be in the second opening and closed state, such that the impedance of the input impedance matching circuit is the second input impedance, and the impedance of the output impedance matching circuit is the second output impedance.

That is, input impedance and output impedance of the matching circuit are adjusted by controlling opening and closed states of S1, S2 and S3, such that the input impedance and output impedance of the matching circuit are matched with source impedance of the RF signal and source impedance of the amplified RF signal respectively, thereby reducing signal reflection and improving signal quality. Furthermore, optimal noise matching, gain and linearity may also be provided for RF signals in different bands.

Figure 3:
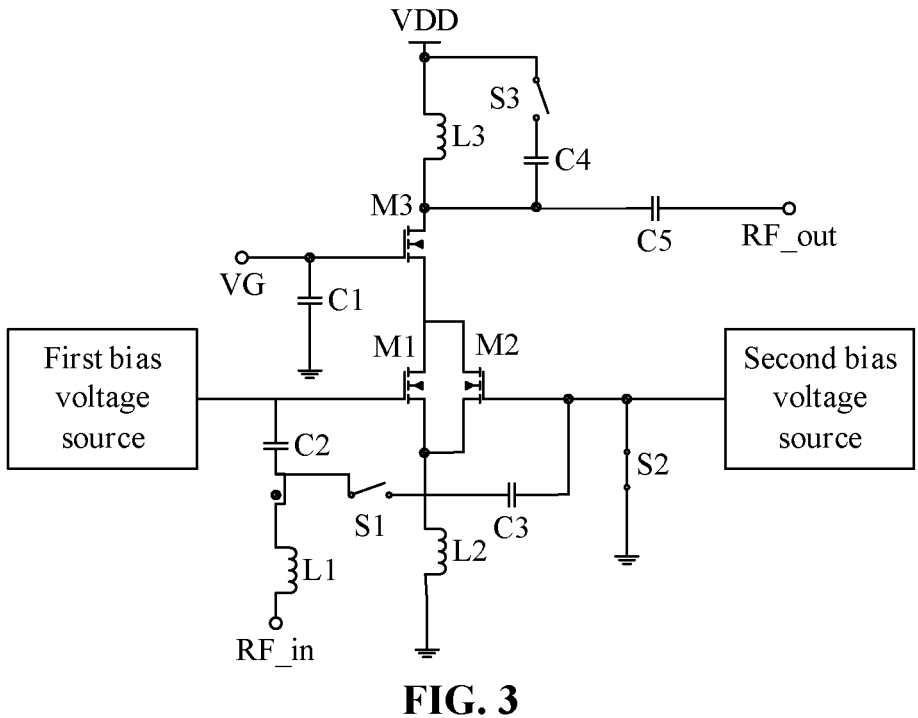
FIG. 3 is a schematic diagram of a composition structure of a high-band low-noise amplifier circuit in an embodiment of the disclosure.

Methods for adjusting impedance of the input impedance matching circuit and the output impedance matching circuit are explained by way of example below. FIG. 3 is a schematic diagram of a composition structure of a high-band low-noise amplifier circuit in an embodiment of the disclosure.

When RF signal is in a high band, the first opening and closed state may be that each of the first switch S1 and the third switch S3 is in an opening state, and the second switch S2 is in a closed state.

As shown in FIG. 3, the input impedance matching circuit may include a first inductor L1, a second inductor L2 and a second capacitor C2. Specific connection thereof is as follows. A first end of L1 is used as the input end RF in of the input impedance matching circuit, a second end of L1 is connected to the gate of M1 through C2, the source of M1 is grounded through L2, and the gate of M2 is grounded through S2.

Here when S2 is in the closed state, the gate of M2 is grounded directly, and then M2 is in a cut-off region, a small equivalent capacitor may be arranged between the source and the drain of M2, which does not affect amplification of RF signal. That is, when RF signal is in the high band, M2 does not participate in amplification of RF signal, and M2 hardly affects impedance and performance of the amplification circuit in the high band.

Furthermore, in the RF signal amplification circuit, RF signal is amplified only by M1 and M3.

Specifically, a method for calculating the first input impedance includes that the impedance is expressed in a plural form, which includes a real part and an imaginary part of the impedance. A gate-source parasitic capacitance of L1 and M1 and transconductance of M1 determine the real part of the first input impedance, and A gate-source parasitic capacitance of L2, C2 and M1 determines the imaginary part of the first input impedance. The real part and the imaginary part of the first input impedance are used to represent the first input impedance. By adjusting L1 and C2, the first input impedance is matched around 50Ω, and the first input impedance is located near the best noise impedance matching point, such that the dual-frequency low-noise amplifier circuit may achieve good noise matching and input matching in the high band.

The aforementioned gate-source parasitic capacitance refers to a parasitic capacitance between a gate and a source of a transistor. A parasitic capacitance refers to a capacitance formed by electronic elements being proximate to each other. The transconductance of M1 refers to variation of a current of the drain divided by variation of a gate-source voltage.

The output impedance matching circuit may include a third inductor L3, a fifth capacitor C5 and a second voltage source VDD. Specific connection thereof is as follows. A first end of L3 is used as the input end of the output impedance matching circuit, the first end of L3 is connected to a first end of C5, a second end of C5 is connected to VDD, and a second end of C5 is used as the output end RF out of the output impedance matching circuit.

It should be noted that when RF signal in the high band is amplified, S3 in the output impedance matching circuit is in the opening state. Then L3 and C5 are connected in series to form the output impedance matching circuit. By setting appropriate values for L3 and C5, the first output impedance is matched around 50Ω, furthermore, the dual-frequency low-noise amplifier circuit has better gain and linearity in the high band.

Figure 4:
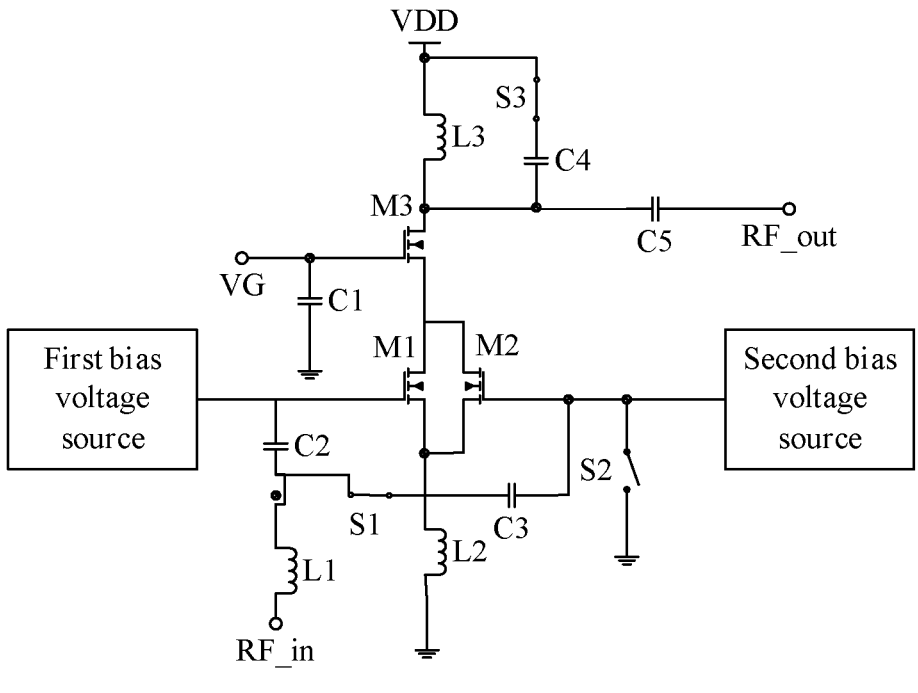
FIG. 4 is a schematic diagram of a composition structure of a low-band low-noise amplifier circuit in an embodiment of the disclosure.

FIG. 4 is a schematic diagram of a composition structure of a low-band low-noise amplifier circuit in an embodiment of the disclosure.

When RF signal is in a low band, the second opening and closed state may be that each of the first switch S1 and the third switch S3 is in a closed state, and the second switch S2 is in an opening state.

As shown in FIG. 4, the input impedance matching circuit may include a first inductor L1, a second inductor L2, a second capacitor C2 and a third capacitor C3. Specific connection thereof is as follows. A first end of L1 is used as the input end RF in of the input impedance matching circuit, a second end of L1 is connected to the gate of M1 through C2, the second end of L1 is also connected to the gate of M2 through S1 and C3, and the source of M1 and the source of M2 are grounded through L2.

It should be noted that when RF signal in the low band is amplified, RF signal is input into the input impedance matching circuit and output to the gate of M1 through L1 and C2, furthermore, RF signal is output to the gate of M2 through S1 and C3, that is, the gate of M1 and the gate of M2 are used as the output end of the input impedance matching circuit or the input end of the RF amplification signal. That is, when S1 is closed and S2 is opened, both M1 and M2 participate in amplification of RF signal.

Furthermore, in the RF signal amplification circuit, RF signal is amplified by M1, M2 and M3.

Specifically, a method for calculating the second input impedance includes that L2, a gate-source parasitic capacitance of M1, a transconductance of M1, a gate-source parasitic capacitance of M2 and a transconductance of M2 determine a real part of the second input impedance, and L1, C2, a gate-source parasitic capacitance of M1, C3 and a gate-source parasitic capacitance of M2 determine an imaginary part of the second input impedance. The real part and the imaginary part of the second input impedance are used to represent the second input impedance. By adjusting C3, the second input impedance is matched around 50Ω, and the second input impedance is located near the best noise impedance matching point, such that the dual-frequency low-noise amplifier circuit may achieve good noise matching and input matching in the low band. Here the transconductance of M2 refers to variation of a current of the drain divided by variation of a gate-source voltage.

The input impedance matching circuit may further include a third inductor L3, a fourth capacitor C4, a fifth capacitor C5 and a second voltage source VDD. Specific connection thereof is as follows. A first end of L3 is used as the input end of the output impedance matching circuit, the first end of L3 is connected to a first end of C4 and a first end of C5, a second end of C5 is used as the output end RF out of the output impedance matching circuit, and a second end of C4 is connected to a second end of L3 and VDD through S3.

It should be noted that when RF signal in the low band is amplified, S3 in the output impedance matching circuit is in the closed state, then S3 is connected in series with C4 and then connected in parallel with L3, and then connected in series with C5. By adjusting C4, L3 and C4 connected in parallel may be equivalent to an inductor larger than L3, so that the second output impedance is matched around 50Ω, furthermore, the dual-frequency low-noise amplifier circuit has better gain and linearity in the low band.

Figure 5:
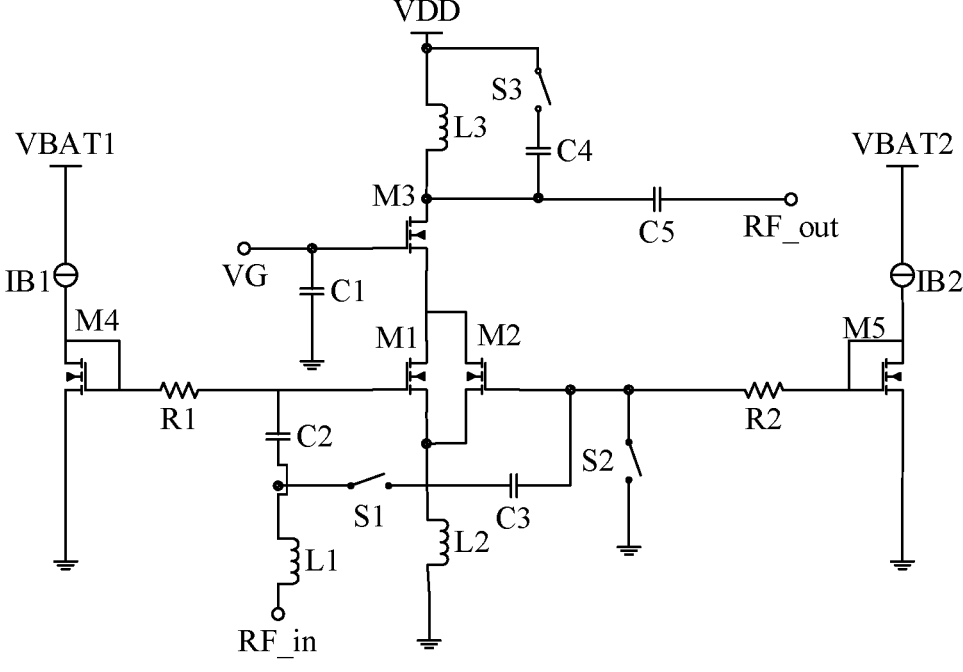
FIG. 5 is a schematic diagram of a third composition structure of a dual-frequency low-noise amplifier circuit in an embodiment of the disclosure.

The first bias voltage source and the second bias voltage source are explained by way of example below, FIG. 5 is a schematic diagram of a third composition structure of a dual-frequency low-noise amplifier circuit in an embodiment of the disclosure.

As shown in FIG. 5, the first voltage source may be provided by a first bias circuit, the first bias circuit may include a first bias current source IB1, a fourth transistor M4 and a third voltage source VBAT1. Specific connection thereof is as follows. A drain of M4 is short-connected to a gate of M4 and is also connected to VBAT1 through IB1, and a source of M4 is grounded. The first bias circuit is connected to the gate of M1, and is configured to provide the first bias voltage, such that the drain and source of M1 are turned on.

The second voltage source may be provided by a second bias circuit, the second bias circuit may include a second bias current source IB2, a fifth transistor M5 and a fourth voltage source VBAT2. Specific connection thereof is as follows. A drain of M5 is short-connected to a gate of M5 and is also connected to VBAT2 through IB2, and a source of M5 is grounded. The second bias circuit is connected to the gate of M2, and is configured to provide the second bias voltage, such that the drain and source of M2 are turned on.

Here the first bias circuit may further include a first resistor R1. Specific connection thereof is as follows. One end of R1 is connected to the gate of M4, and the other end of R1 is connected to the gate of M1. R1 is configured to reduce influence of noise generated by the first bias circuit on noise performance of the amplifier.

The second bias circuit may further include a second resistor R2. Specific connection thereof is as follows. One end of R2 is connected to the gate of M5, and the other end of R2 is connected to the gate of M2. R2 is configured to reduce influence of noise generated by the second bias circuit on noise performance of the amplifier.

The above descriptions are only specific implementations of the disclosure, however, the scope of protection of the disclosure is not limited thereto. Variation or replacement readily conceivable by any person skilled in the art within the technical scope of the disclosure shall fall within the scope of protection of the disclosure. Therefore, the scope of protection of the disclosure should be subjected to the scope of protection of the claims.

The disclosure provides a dual-frequency low-noise amplifier circuit, including an input impedance matching circuit including an input switch component, a RF signal amplification circuit, and an output impedance matching circuit including an output switch component. An input end of the input impedance matching circuit is input with a RF signal, an output end of the input impedance matching circuit is connected to an input end of the output impedance matching circuit through the RF signal amplification circuit, and an output end of the output impedance matching circuit outputs an amplified RF signal. In response to the RF signal amplification circuit amplifying a RF signal in a first band, the input switch and the output switch are controlled to be in a first opening and closed state, such that an impedance of the input impedance matching circuit is a first input impedance, and an impedance of the output impedance matching circuit is a first output impedance. In response to the RF signal amplification circuit amplifying a RF signal in a second band, the input switch and the output switch are controlled to be in a second opening and closed state, such that the impedance of the input impedance matching circuit is a second input impedance, and the impedance of the output impedance matching circuit is a second output impedance. In this way, input impedance and output impedance of the matching circuit are adjusted by controlling opening and closed states of the switch, such that the input impedance and output impedance of the matching circuit are matched with source impedance of the RF signal and source impedance of the amplified RF signal respectively, thereby reducing signal reflection and improving signal quality. Furthermore, optimal noise matching, gain and linearity may also be provided for RF signals in different bands.

What is claimed is:

1. A dual-frequency low-noise amplifier circuit, comprising an input impedance matching circuit including an input switch component, a radio frequency (RF) signal amplification circuit, and an output impedance matching circuit comprising an output switch component, wherein:

an input end of the input impedance matching circuit is configured to input with a RF signal, an output end of the input impedance matching circuit connected to an input end of the output impedance matching circuit through the RF signal amplification circuit, and an output end of the output impedance matching circuit outputting an amplified RF signal, in response to the RF signal amplification circuit amplifying a RF signal in a first band, controlling the input switch and the output switch to be in a first opening and closed state, such that an impedance of the input impedance matching circuit is a first input impedance, and an impedance of the output impedance matching circuit is a first output impedance, in response to the RF signal amplification circuit amplifying a RF signal in a second band, controlling the input switch and the output switch to be in a second opening and closed state, such that the impedance of the input impedance matching circuit is a second input impedance, and the impedance of the output impedance matching circuit is a second output impedance;

wherein the RF signal amplification circuit comprises a first transistor, a second transistor, a third transistor, a first capacitor and a first voltage source, a drain of the first transistor is connected to a drain of the second transistor and a source of the third transistor, a source of the first transistor is connected to a source of the second transistor, and a gate of the first transistor and a gate of the second transistor are connected to the output end of the input impedance matching circuit, a drain of the third transistor is connected to the input end of the output impedance matching circuit, a gate of the third transistor is grounded through the first capacitor and is further connected to the first voltage source;

wherein the input impedance matching circuit further comprises a first inductor, a second inductor, a second capacitor and a third capacitor, and the input switch component comprises a first switch and a second switch, a first end of the first inductor is used as the input end of the input impedance matching circuit, a second end of the first inductor is connected to the gate of the first transistor through the second capacitor and is connected in series with the third capacitor through the first switch and then connected to the gate of the second transistor, a first end of the second switch is connected to the gate of the second transistor, and a second end of the second switch is grounded, a first end of the second inductor is connected to the source of the first transistor, and a second end of the second inductor is grounded.

2. The dual-frequency low-noise amplifier circuit of claim 1, wherein the output impedance matching circuit further comprises a third inductor, a fourth capacitor, a fifth capacitor and a second voltage source, and the output switch component comprises a third switch, a first end of the third inductor is used as the input end of the output impedance matching circuit and is connected to a first end of the fourth capacitor and a first end of the fifth capacitor, a second end of the fifth capacitor is used as the output end of the output impedance matching circuit, and a second end of the fourth capacitor is connected to a second end of the third inductor and the second voltage source through the third switch.

3. The dual-frequency low-noise amplifier circuit of claim 2, wherein the first opening and closed state is that each of the first switch and the third switch is in an opening state, and the second switch is in a closed state, the second opening and closed state is that each of the first switch and the third switch is in a closed state, and the second switch is in an opening state.

4. The dual-frequency low-noise amplifier circuit of claim 1, further comprising:

a first bias circuit connected to the gate of the first transistor, and configured to provide a first bias voltage; and a second bias circuit connected to the gate of the second transistor, and configured to provide a second bias voltage.

5. A dual-frequency low-noise amplifier circuit, comprising an input impedance matching circuit including an input switch component, a radio frequency (RF) signal amplification circuit, and an output impedance matching circuit comprising an output switch component, wherein:

an input end of the input impedance matching circuit is configured to input with a RF signal, an output end of the input impedance matching circuit connected to an input end of the output impedance matching circuit through the RF signal amplification circuit, and an output end of the output impedance matching circuit outputting an amplified RF signal, in response to the RF signal amplification circuit amplifying a RF signal in a first band, controlling the input switch and the output switch to be in a first opening and closed state, such that an impedance of the input impedance matching circuit is a first input impedance, and an impedance of the output impedance matching circuit is a first output impedance, in response to the RF signal amplification circuit amplifying a RF signal in a second band, controlling the input switch and the output switch to be in a second opening and closed state, such that the impedance of the input impedance matching circuit is a second input impedance, and the impedance of the output impedance matching circuit is a second output impedance, wherein the RF signal amplification circuit comprises a first transistor, a second transistor, a third transistor, a first capacitor and a first voltage source, a drain of the first transistor is connected to a drain of the second transistor and a source of the third transistor, a source of the first transistor is connected to a source of the second transistor, and a gate of the first transistor and a gate of the second transistor are connected to the output end of the input impedance matching circuit, a drain of the third transistor is connected to the input end of the output impedance matching circuit, a gate of the third transistor is grounded through the first capacitor and is further connected to the first voltage source, the dual-frequency low-noise amplifier circuit further comprising:

a first bias circuit connected to the gate of the first transistor, and configured to provide a first bias voltage; and a second bias circuit connected to the gate of the second transistor, and configured to provide a second bias voltage, wherein the first bias circuit comprises a first bias current source, a fourth transistor and a third voltage source, a drain of the fourth transistor is connected to the third voltage source through the first bias current source and is short-connected to a gate of the fourth transistor, and a source of the fourth transistor is grounded, the second bias circuit comprises a second bias current source, a fifth transistor and a fourth voltage source, a drain of the fifth transistor is connected to the fourth voltage source through the second bias current source and is short-connected to a gate of the fifth transistor, and a source of the fifth transistor is grounded.

6. The dual-frequency low-noise amplifier circuit of claim 5, wherein the first bias circuit further comprises a first resistor, through which the gate of the fourth transistor is connected to the gate of the first transistor, the second bias circuit further comprises a second resistor, through which the gate of the fifth transistor is connected to the gate of the second transistor.

7. The dual-frequency low-noise amplifier circuit of claim 1, wherein the first band is a high band, and the second band is a low band.

* * * * *